United States Patent
Jeon (10) Patent No.: US 10,107,849 B2
(45) Date of Patent: Oct. 23, 2018

(54) DIAGNOSTIC SYSTEM FOR A HOME APPLIANCE AND METHOD FOR DIAGNOSING A HOME APPLIANCE

(71) Applicant: LG ELECTRONICS INC., Seoul (KR)

(72) Inventor: Chansung Jeon, Seoul (KR)

(73) Assignee: LG ELECTRONICS INC., SEOUL (KR)

( * ) Notice: Subject to any disclaimer, the term of this patent is extended or adjusted under 35 U.S.C. 154(b) by 240 days.

(21) Appl. No.: 15/071,681

(22) Filed: Mar. 16, 2016

(65) Prior Publication Data

US 2016/0274161 A1    Sep. 22, 2016

(30) Foreign Application Priority Data

Mar. 16, 2015  (KR) .................. 10-2015-0035885

(51) Int. Cl.
| | |
|---|---|
| *G01R 31/28* | (2006.01) |
| *G01R 11/63* | (2006.01) |
| *G01R 11/32* | (2006.01) |
| *G01R 31/02* | (2006.01) |
| *G01R 22/06* | (2006.01) |
| *G01R 11/60* | (2006.01) |
| *G01R 21/00* | (2006.01) |
| *H04L 12/28* | (2006.01) |

(52) U.S. Cl.
CPC .............. *G01R 31/02* (2013.01); *G01R 11/60* (2013.01); *G01R 21/00* (2013.01); *G01R 22/06* (2013.01); *H04L 12/2825* (2013.01); *H04L 2012/285* (2013.01)

(58) Field of Classification Search
CPC ...... G01R 31/02; G01R 31/025; G01R 21/00; G01R 11/60; H04L 12/2825; H04L 2012/285
USPC ....................................... 324/511, 103 R, 142
See application file for complete search history.

(56) References Cited

U.S. PATENT DOCUMENTS

| | | | |
|---|---|---|---|
| 6,502,411 B2 * | 1/2003 | Okamoto ................ | F25B 49/00 236/51 |
| 8,717,188 B2 * | 5/2014 | Han .................... | H04L 12/2825 340/539.1 |
| 2001/0025349 A1 | 9/2001 | Sharood et al. | |

(Continued)

FOREIGN PATENT DOCUMENTS

| | | |
|---|---|---|
| KR | 10-2011-0127032 | 11/2011 |
| KR | 10-2013-0015208 A | 2/2013 |

(Continued)

OTHER PUBLICATIONS

Korean Notice of Allowance dated Dec. 27, 2016 issued in Application No. 10-2015-0035885.

(Continued)

*Primary Examiner* — Amy He
(74) *Attorney, Agent, or Firm* — Ked & Associates, LLP (57) ABSTRACT

A diagnostic system for a home appliance, and a method for diagnosing the home appliance, the method according to one aspect including collecting consumed electric power information of the home appliance by a power measuring part; transmitting the collected electric power information to an external server; and receiving operation state information of the home appliance analyzed from the external server by the home appliance.

14 Claims, 5 Drawing Sheets

(56) References Cited

U.S. PATENT DOCUMENTS

2013/0024385 A1 1/2013 Kang
2013/0311610 A1* 11/2013 Kim .................... H04L 12/2818
                 709/217

FOREIGN PATENT DOCUMENTS

KR 10-2013-0048358  5/2013
KR 10-2014-0089272 A 7/2014

OTHER PUBLICATIONS

Korean Office Action issued in Application No. 10-2015-0035885 dated Apr. 21, 2016.
European Search Report issued in Application No. 16158084.0 dated Jun. 3, 2016.

* cited by examiner

DIAGNOSTIC SYSTEM FOR A HOME APPLIANCE AND METHOD FOR DIAGNOSING A HOME APPLIANCE

CROSS-REFERENCE TO RELATED APPLICATION(S)

This application claims priority under 35 U.S.C. § 119 and 35 U.S.C. § 365 to Korean Patent Application No. 10-2015-0035885, filed in Korea on Mar. 16, 2015, whose entire disclosure is hereby incorporated by reference.

BACKGROUND

1. Field

A diagnostic system for a home appliance and a method for diagnosing the home appliance are disclosed herein.

2. Background

A home appliance may store a set value for performing a predetermined operation, information generated while the operation is performed, malfunction information, or the like while performing the operation, and particularly, enable a user who uses the home appliance to recognize a state of the home appliance by outputting a predetermined alarm when a malfunction occurs. Such a home appliance may not only simply notify completion of the operation, but also output detailed malfunction information through an output device, e.g., a display and a lamp.

When the malfunction occurs while the home appliance is used, the user may make a call to a service center, explain an abnormal state of the home appliance, and inquire about a solution to the abnormal state. However, since it may not be easy for the user as a layman to exactly recognize and explain the abnormal state of the home appliance to the service center, it may be difficult to solve the problem. When the abnormal state occurring from the home appliance is not caused by the malfunction of the home appliance but by a user's erroneous operation, a repairman may unnecessarily visit the user's home.

Recently, to detect whether the home appliance breaks down, a technique has been proposed in which a camera is installed inside the home appliance to take a picture thereof, or a signal tone formed in a predetermined pattern is transmitted to the service center. However, since it may be difficult to make an accurate diagnosis, the effectiveness is decreased. If a state of the home appliance is accurately recognized, and a solution thereof is proposed, the abnormal state of the home appliance may be more rapidly solved.

BRIEF DESCRIPTION OF THE DRAWINGS

The embodiments will be described in detail with reference to the following drawings in which like reference numerals refer to like elements wherein.

DETAILED DESCRIPTION

Figure 1:
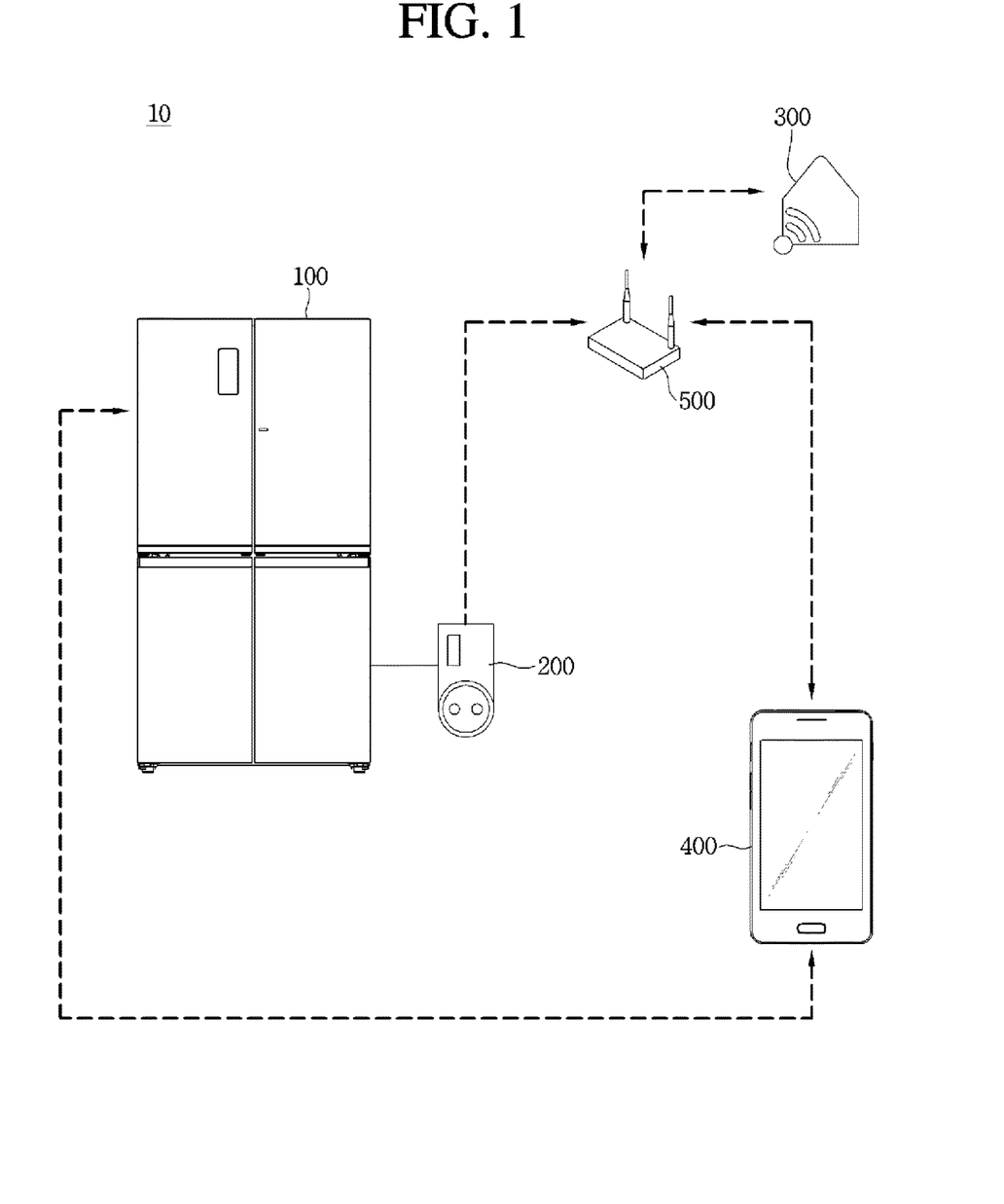
FIG. 1 is a schematic view illustrating a diagnostic system for a home appliance.
Figure 2:
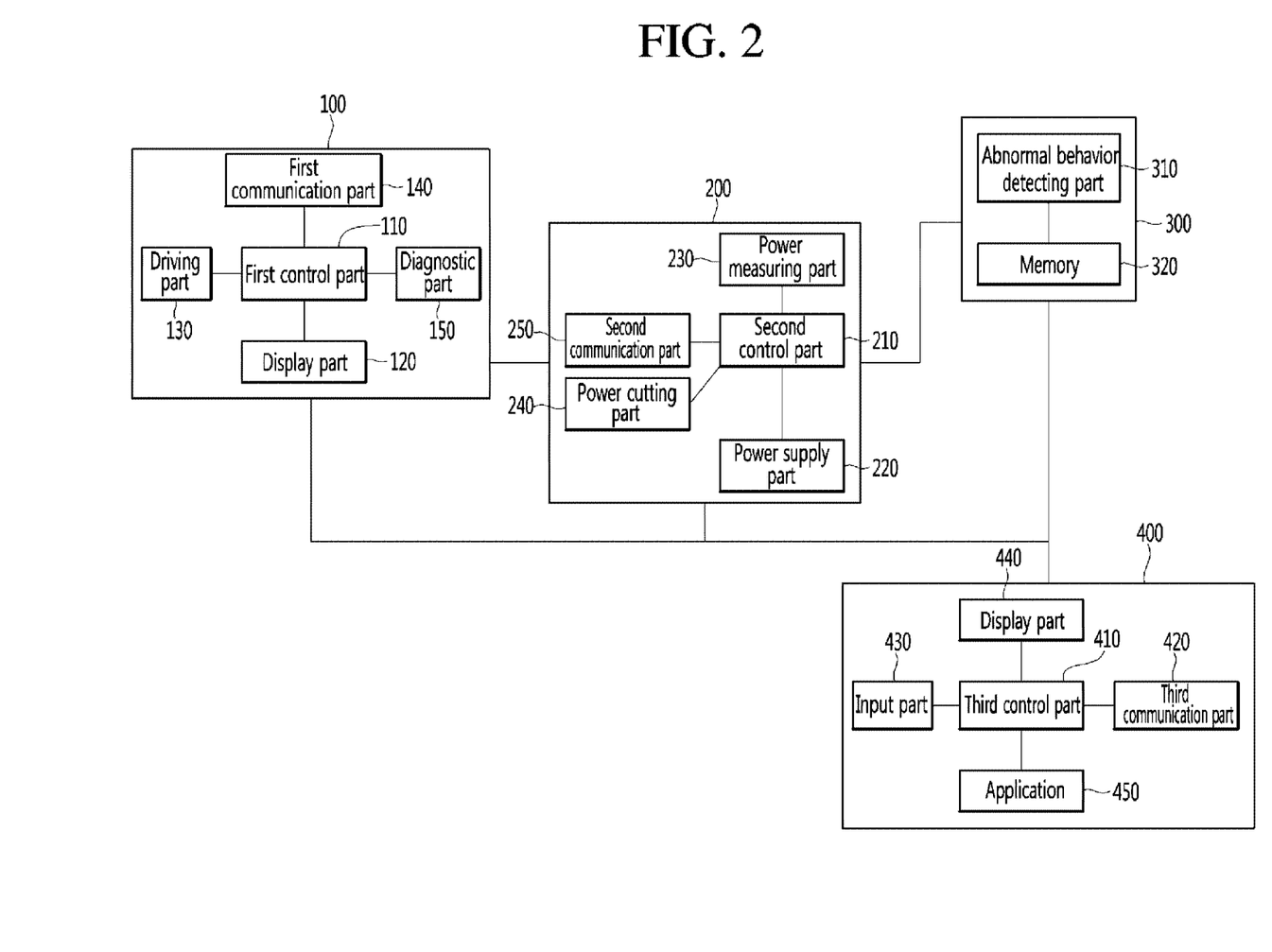
FIG. 2 is a block diagram of the diagnostic system for the home appliance.

Referring to FIGS. 1 and 2, a diagnostic system 10 for a home appliance may include a part or all of a home appliance 100, a smart plug 200 which may detect electric power information of the home appliance 100, an external server 300 which may detect a state of the home appliance 100 based on the electric power information obtained in the smart plug 200, and a terminal 400 which may receive a state result detected in the external server 300. The home appliance 100 may include various products such as a refrigerator, a cooking apparatus, a washer, a cleaner, a water purifier and an air conditioner, but a type of the home appliance 100 is not limited.

The home appliance 100 may include a part or all of a first control part (or controller) 110, a display part (or display) 120, a driving part (or driver) 130, a first communication part (or first communication module) 140 and a diagnostic part (or diagnostic module) 150. The above-described elements are not essential to realize the home appliance 100. The home appliance 100 described in the specification may have more or fewer elements than described above.

The first control part 110 may control an entire operation of the home appliance 100. The first control part 110 may provide or process appropriate information or functions for driving the home appliance 100 by processing a signal, data, information or the like input or output through the elements or driving the elements. The display part 120 may display information about an operation and/or a state of the home appliance 100. The information about the operation and/or the state may include information about malfunction, information about an operation state, information which is received from other elements, and so on. Displaying of the display part 120 may be performed through a display screen provided at an exterior of the home appliance 100, or a sound message output through a speaker.

The driving part 130 may control intensity, electric power, or the like of the element which drives the home appliance 100. For example, the driving part 130 may control intensity of a power consumption part which consumes the electric power in the home appliance 100. A user may control an operation of the driving part 130 through an operating part.

The first communication part 140 may include one or more communication modules which enable wired or wireless communication between the home appliance 100 and the smart plug 200, between the home appliance 100 and the external server 300 and between the home appliance 100 and the terminal 400. The first communication part 140 may include one or more communication modules which connect the home appliance 100 with one or more networks. Therefore, the home appliance 100 may communicate with one or more of the smart plug 200, the external server 300 and the terminal 400. However, the first communication part 140 may communicate with only the smart plug 200. Alternatively, the first communication part 140 may be omitted.

The home appliance 100 may communicate with the terminal 400 through a short range communication module. The short range communication module may perform short range communication, and may support the short range communication using at least one of Bluetooth, Radio Frequency Identification (RFID), Infrared Data Association (IrDA), Ultra Wideband (UWB), ZigBee, Near Field Communication (NFC), Wireless-Fidelity (Wi-Fi), Wi-Fi Direct, and Wireless Universal Serial Bus (Wireless USB).

The diagnostic part 150 may autonomously diagnose a normal state or an abnormal state of the home appliance 100. When a diagnostic command is received through inputting of the user or the first communication part 140, the diagnostic part 150 may diagnose the home appliance 100. A diagnosing operation of the diagnostic part 150 may be performed by checking whether the elements are normally operating, or detecting the state of the elements through a sensor provided at each of the elements. Diagnosis details of the diagnostic part 150 are displayed on the display part 120 to be recognized by the user.

The smart plug 200 may be connected to a plug of the home appliance 100 so as to provide a function of monitoring an electric power consumption of the home appliance 100, a function of cutting standby power, and a remote control function. The smart plug 200 may include a part or all of a second control part (or second controller) 210, a power supply part (or power supply) 220, a power measuring part (or power measuring device) 230, a power cutting part (or power cutting device) 240 and a second communication part (or second communication device) 250.

The second control part 210 may control an entire operation of the smart plug 200. The second control part 210 may provide or process appropriate information or a function for driving the smart plug 200 by processing or driving a signal, data, or information input or output through the elements. The power supply part 220 may serve to supply electric power supplied from a distribution panel in a home to a socket outlet, and thus to supply the electric power to the home appliance 100 connected to the smart plug 200. The power measuring part 230 may measure the standby power and the electric power supplied to the home appliance 100 connected through the plug. A value measured by the power measuring part 230 may be transferred to the external server 300 or the terminal 400 through the second communication part 250.

The power cutting part 240 may operate a switch by way of a controller, and thus cut the electric power when a standby power cutting command or a dangerous situation detecting signal is received through the second communication part 250. The dangerous situation detecting signal may be a signal which is received from the home appliance 100 when the first control part 110 of the home appliance 100 determines that an abnormal situation occurs in the home appliance 100.

Like the first communication part 140, the second communication part 250 may be one or more communication modules which enable the wired or wireless communication between the smart plug 200 and the home appliance 100, between the smart plug 200 and the terminal 400, and between the smart plug 200 and the external server 300. To this end, a communication device 500 which enables communication of the first communication part 140 and the second communication part 250 may be installed in the home in which the home appliance 100 is provided.

The external server 300 may include a server which is managed by a manufacturer of the home appliance 100 or a consignment company of the manufacturer, a server which provides a service for the home appliance 100, a web server, and so on. A type of the external server 300 is not limited. The external server 300 may include an abnormal operation detecting part (or abnormal operation detector) 310 and a memory 320. The abnormal operation detecting part 310 may determine an abnormal operation of the home appliance 100, an error in the home appliance 100, whether the home appliance 100 is erroneously used by the user, or the like through a consumed electric power value of the home appliance 100 received from the smart plug 200.

The abnormal operation detected through the electric power value may include whether the home appliance 100 which receives the electric power is not used for a long period of time, a power consumption due to slight door opening of a refrigerator, an excessive operation of a compressor which is provided at the refrigerator or an air conditioner, and so on. Detecting of the abnormal operation detecting part 310 may be determined based on data stored in the memory 320.

To this end, electric power information and a reference power value, like an energy rating, of the home appliance 100, a specific user's power using pattern, a power using pattern according to malfunction of the home appliance 100, or the like, may be stored in the memory 320. The abnormal operation detecting part 310 may determine the operation state of the home appliance 100 by comparing the power consumption of the home appliance 100 received from the smart plug 200 with a value stored in the memory 320. A detailed process in which the external server 300 determines the operation state of the home appliance 100 through the electric power value will be described later.

The terminal 400 may include a mobile phone, a smart phone, a laptop computer, a digital broadcasting terminal, a personal digital assistant (PDA), a portable multimedia player (PMP), a navigation, a slate PC, a tablet PC, an ultrabook, a wearable device, e.g., a smart watch, a smart glass and a head mounted display (HMD), and so on. The terminal 400 may include a part or all of a third control part (or third controller) 410 which may control functions of the terminal 400, a third communication part (or third communication device) 420 which may be connected to a network for communication, an input part (or input) 430 through which the user may input a command, and a display part (or display) 440 which may display information about a state of the home appliance 100.

An application 450 which communicates with the home appliance 100, the smart plug 200 and the external server 300, may receive information about the home appliance 100, and control the operation of the home appliance 100, and may be installed at the terminal 400. The terminal 400 may receive information about the electric power consumption of the home appliance 100 from the smart plug 200, and also receive information about the state of the home appliance 100 from the external server 300. The user may control the operation of the home appliance 100 based on the received information. These processes may be performed through the application 450 installed at the terminal 400.

Figure 3:
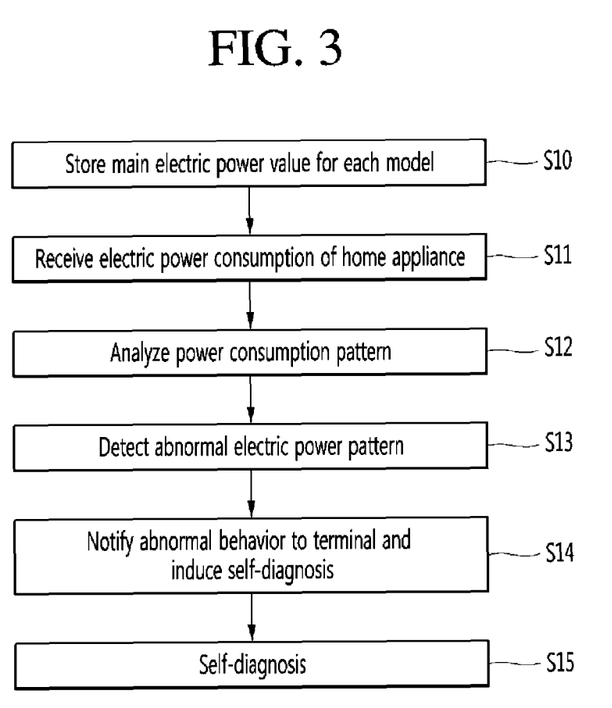
FIG. 3 is a flowchart illustrating a diagnostic process of an external server.

A diagnostic process of the external server 300 will be described in detail with reference to FIGS. 3 and 4. A main electric power value for each model manufactured by the manufacturer of the home appliance 100 may be set or stored in the memory 320 (S10). The external server 300 may receive the consumed electric power value of the home appliance 100 which is measured by the smart plug 200 (S11). The external server 300 may analyze an electric power consumption pattern by comparing the electric power value of the home appliance 100 with the received consumed electric power value (S12), and determine whether there is an abnormal state (S13).

Figure 4:
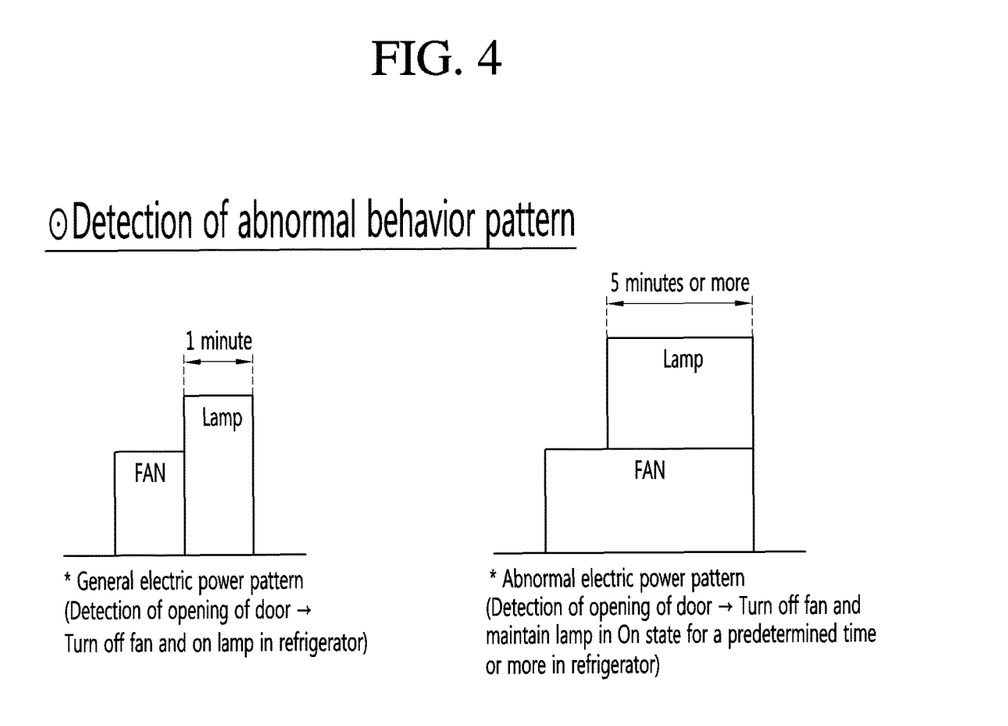
FIG. 4 illustrates a process of detecting an abnormal operation pattern of the home appliance.

In the case in which the home appliance 100 is a refrigerator, when a door of the refrigerator is opened, an operation of a fan in the refrigerator may be stopped and a lamp provided in the refrigerator may be turned on, as illustrated in FIG. 4. In the case of the refrigerator, the electric power may be alternatively consumed according to the operation of the fan and the turning-on of the lamp. If the consumed electric power value measured from the smart plug 200 corresponds to a sum of the consumed electric power value according to the operation of the fan and the consumed electric power value according to the turning-on of the lamp, the external server 300 may determine that the lamp installed in the refrigerator is not operated in response to opening and closing of the door.

When the consumed electric power value of the home appliance 100 is analyzed, and the consumed electric power value of the home appliance 100 is different from a usual state or a consumed electric power value of the same home appliance provided in another home, the abnormal operation may be notified to the terminal 400, and thus the user may recognize the abnormal state (S14). If necessary, the external server 300 may transfer a self-diagnosis command to the home appliance 100, and the diagnostic part 150 of the home appliance 100 may perform a self-diagnosis (S15).

Figure 5:
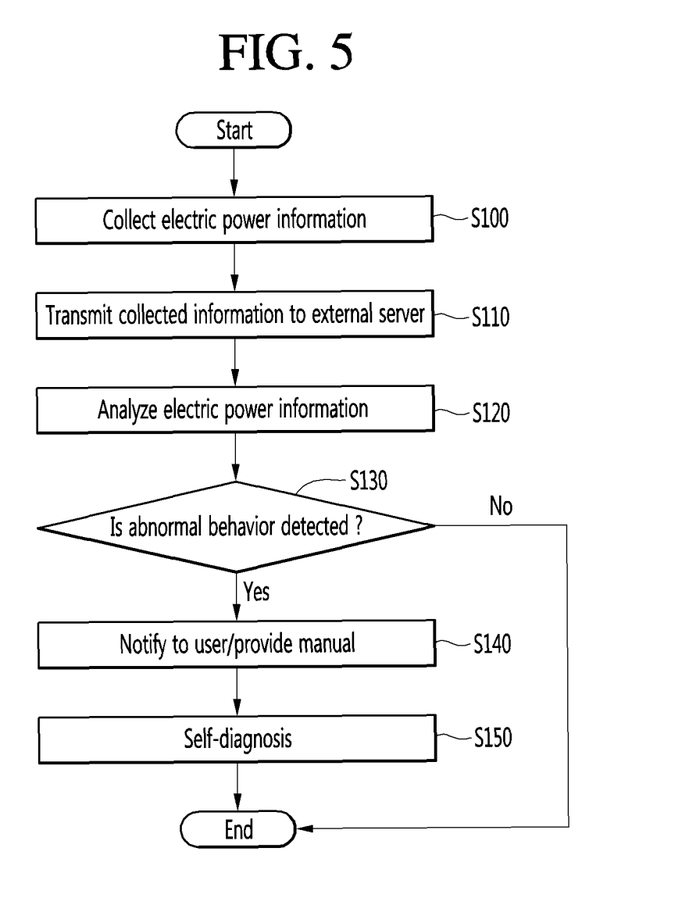
FIG. 5 is a flowchart illustrating a method for diagnosing the home appliance.

Referring to FIG. 5, while the home appliance 100 is operated, the smart plug 200 in which the plug of the home appliance 100 is inserted may collect information about the power consumption of the home appliance 100 through the power measuring part 230 (S100). The information about the power consumption of the home appliance 100 measured by the smart plug 200 may then be transmitted to the external server 300 through the second communication part 250 (S110). In this process, the information about the measured power consumption may be transmitted to the terminal 400 so as to alert the user.

The external server 300 may analyze the information about the power consumption of the home appliance 100 (S120). In the operation S120 of analyzing the electric power information, an operation time of the home appliance 100, an electric power consumption, a standby time and the like may be analyzed based on the consumed electric power value of the home appliance 100. The abnormal operation detecting part 310 of the external server 300 may compare an analyzed value with the data stored in the memory 320, and determine whether the home appliance 100 is abnormally operated (S130).

When the abnormal operation of the home appliance 100 is detected, a signal for notifying the abnormal operation may be transmitted to the terminal 400 and the home appliance 100, and information about the abnormal operation and a user manual corresponding to the abnormal operation may be provided to the user (S140). At this point, the external server 300 may directly transmit the information about the abnormal operation and the user manual corresponding to the abnormal operation to the home appliance 100. Alternatively, the smart plug 200 may receive the information about the abnormal operation and the user manual corresponding to the abnormal operation, and then may transfer them to the home appliance 100.

The display part 120 of the home appliance 100 may display the received information about the abnormal operation and/or the user manual corresponding to the abnormal operation. Therefore, the user may recognize the abnormal operation of the home appliance 100 through the terminal 400, and thus may diagnose the state of the home appliance 100 at an early stage. The home appliance 100 may receive the user's command or the self-diagnosis command provided from the external server 300. In this case, the home appliance 100 may perform the self-diagnosis, may exactly grasp a current state, and thus may solve the problem. A detection part to which the NFC is tagged may be provided at an exterior of the home appliance 100, and the home appliance 100 may perform the self-diagnosis by tagging the terminal 400 to which the abnormal state is reported.

The present disclosure is directed to a diagnostic system for a home appliance, which may be able to diagnose an abnormal phenomenon at an early stage, and prevent malfunction in advance, and a method for diagnosing the home appliance. A method for diagnosing a home appliance may include collecting consumed electric power information of the home appliance by a power measuring part; transmitting the collected electric power information to an external server; and receiving operation state information of the home appliance analyzed from the external server by the home appliance. A diagnostic system for a home appliance, including the home appliance; and a smart plug having a power measuring part which may be connected with a plug of the home appliance to detect electric power information of the home appliance, wherein the smart plug may transmit the detected electric power information to an external server, and receive a state result of the home appliance determined from the external server.

In the description of embodiments, terms such as first, second, A, B, (a), (b) or the like may be used when describing components of the present disclosure. Each of these terminologies is not used to define an essence, order or sequence of a corresponding component but used merely to distinguish the corresponding component from other component(s). It should be noted that if it is described in the specification that one component is "connected," "coupled" or "joined" to another component, the former may be directly "connected," "coupled," and "joined" to the latter or "connected", "coupled", and "joined" to the latter via another component.

Any reference in this specification to "one embodiment," an "embodiment," "example embodiment," etc., means that a particular feature, structure, or characteristic described in connection with the embodiment is included in at least one embodiment of the disclosure. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for diagnosing a home appliance, comprising:
   collecting consumed electric power information of the home appliance by using a power measuring device of a smart plug connected to the home appliance;
   transmitting, by the smart plug, the collected electric power information to an external server; and
   receiving operation state information of the home appliance based on analysis of the collected electric power information from the external server by the home appliance,
   wherein when the home appliance receives a request for a self-diagnosis from the external server or a terminal which is able to communicate with the home appliance, the home appliance performs the self-diagnosis using a diagnostic device provided in the home appliance.

2. The method according to claim 1, wherein the smart plug further includes a communication device which transmits the collected electric power information of the home appliance to the external server.

3. The method according to claim 2, wherein the smart plug receives information about an abnormal operation of the home appliance and a user manual corresponding to the abnormal operation, and then transfers the information about the abnormal operation and the user manual corresponding to the abnormal operation to the home appliance.

4. The method according to claim 1, wherein the home appliance receives information about an abnormal operation of the home appliance and a user manual corresponding to the abnormal operation from the external server.

5. The method according to claim 4, wherein the home appliance includes a display which displays the information about the abnormal operation and the user manual corresponding to the abnormal operation.

6. A diagnostic system for a home appliance, comprising:
the home appliance; and
a smart plug having a power measuring device which is connected with a plug of the home appliance to detect electric power information of the home appliance,
wherein the smart plug transmits the detected electric power information to an external server, and receives a state result of the home appliance determined based on the detected electric power information from the external server,
wherein the home appliance comprises a communication device which receives a request for a diagnosis from the external server or an external terminal and a diagnostic device Which performs the diagnosis.

7. The diagnostic system according to claim 6, wherein the smart plug receives information about an abnormal operation of the home appliance and a user manual corresponding to the abnormal operation, and then transfers the information about the abnormal operation and the user manual corresponding to the abnormal operation to the home appliance.

8. The diagnostic system according to claim 7, wherein the home appliance includes a display which displays the information about the abnormal operation of the home appliance and the user manual corresponding to the abnormal operation.

9. The diagnostic system according to claim 6, wherein the home appliance receives information about an abnormal operation of the home appliance and a user manual corresponding to the abnormal operation from the external server.

10. The diagnostic system according to claim 9, wherein the home appliance includes a display which displays the information about the abnormal operation of the home appliance and the user manual corresponding to the abnormal operation.

11. The diagnostic system according to claim 6, wherein the smart plug further includes a power cutting device which cuts electric power by operating a switch when a power cutting command or a dangerous situation detecting signal is generated from the external server.

12. A method for diagnosing a home appliance, comprising:
collecting consumed electric power information of the home appliance by using a power measuring device;
transmitting the collected electric power information to an external server;
comparing the collected electric power information with a predetermined reference power value stored in a memory;
detecting an abnormal operation of the home appliance using an abnormal operation detector and the compared electric power information;
providing abnormal operation information and a user manual to a user terminal or the home appliance; and
performing a diagnosis of a problem of the home appliance using a diagnostic device.

13. The method according to claim 12, wherein a smart plug is connected to a plug of the home appliance, and the smart plug includes the power measuring device.

14. The method according to claim 13, wherein the smart plug further includes a communication device which transmits the collected electric power information of the home appliance to the external server.

* * * * *